United States Patent
Cho et al.

(10) Patent No.: US 9,844,142 B2
(45) Date of Patent: Dec. 12, 2017

(54) RADIANT HEAT CIRCUIT BOARD AND METHOD FOR MANUFACTURING THE SAME

(75) Inventors: In Hee Cho, Seoul (KR); Yun Ho An, Seoul (KR); Eun Jin Kim, Seoul (KR); Hae Yeon Kim, Seoul (KR); Jae Man Park, Seoul (KR); Hyun Gyu Park, Seoul (KR); Hyuk Soo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 563 days.

(21) Appl. No.: 13/811,365

(22) PCT Filed: Jul. 15, 2011

(86) PCT No.: PCT/KR2011/005218
§ 371 (c)(1),
(2), (4) Date: Jan. 21, 2013

(87) PCT Pub. No.: WO2012/011701
PCT Pub. Date: Jan. 26, 2012

(65) Prior Publication Data
US 2013/0118782 A1  May 16, 2013

(30) Foreign Application Priority Data

Jul. 20, 2010 (KR) .................... 10-2010-0070187
Sep. 29, 2010 (KR) .................... 10-2010-0094630

(51) Int. Cl.
*H05K 1/00* (2006.01)
*H05K 1/02* (2006.01)
(Continued)

(52) U.S. Cl.
CPC .......... *H05K 1/181* (2013.01); *H01L 23/3677* (2013.01); *H05K 1/03* (2013.01);
(Continued)

(58) Field of Classification Search
CPC .......... H05K 3/0061; H05K 1/03; H05K 1/09; H05K 1/181; H05K 1/0204;
(Continued)

(56) References Cited

U.S. PATENT DOCUMENTS 5,050,040 A * 9/1991 Gondusky et al. ........... 361/708
5,523,919 A * 6/1996 Canova ......................... 361/720
(Continued)

FOREIGN PATENT DOCUMENTS

CN    1466782 A    1/2004
CN    101252157 A    8/2008
(Continued)

OTHER PUBLICATIONS

Office Action dated May 31, 2013 in Taiwanese Application No. 100124564, filed Jul. 12, 2011.
(Continued)

*Primary Examiner* — Ishwarbhai B Patel
(74) *Attorney, Agent, or Firm* — Saliwanchik, Lloyd & Eisenschenk

(57) ABSTRACT

Disclosed are a radiant heat circuit board and a method for manufacturing the same. The radiant heat circuit board, which is used to mount a heat emitting device thereon, includes a metallic plate including a metallic protrusion having a solder to which the heat emitting device is attached, a bonding layer on the metallic protrusion, an insulating layer on the metallic plate to expose the metallic protrusion, and a circuit pattern on the insulating layer. Heat emitted from the heat emitting device is directly transferred to the metallic plate by providing the metallic plate including a heat radiation protrusion under the mounting pad, so that heat radiation efficiency is increased. The surface of the heat radiation protrusion is plated with an alloy including copper, (Continued)

thereby improving the adhesive property with respect to the solder, so that the failure rate is reduced.

10 Claims, 17 Drawing Sheets

(51) Int. Cl.
    *H05K 1/18*     (2006.01)
    *H05K 3/00*     (2006.01)
    *H05K 1/03*     (2006.01)
    *H05K 1/09*     (2006.01)
    *H01L 23/367*     (2006.01)

(52) U.S. Cl.
    CPC ............ *H05K 1/09* (2013.01); *H05K 3/0061* (2013.01); *H01L 2224/48227* (2013.01); *H05K 1/0204* (2013.01); *H05K 2201/10106* (2013.01); *H05K 2203/0369* (2013.01)

(58) Field of Classification Search
    CPC .. H05K 2203/0369; H05K 2201/10106; H01L 23/3677; H01L 2224/48227
    USPC ........... 174/250–268; 361/706, 760; 257/711
    See application file for complete search history.

(56) References Cited

U.S. PATENT DOCUMENTS

| | | | | |
|---|---|---|---|---|
| 5,747,876 | A * | 5/1998 | Majumdar et al. | ............ 257/687 |
| 6,205,028 | B1 * | 3/2001 | Matsumura | ................... 361/720 |
| 6,376,908 | B1 * | 4/2002 | Gaku et al. | ................... 257/707 |
| 6,524,943 | B1 | 2/2003 | Sakuyama | |
| 6,930,332 | B2 * | 8/2005 | Hashimoto et al. | ............ 257/98 |
| 2003/0127725 | A1 | 7/2003 | Sugaya et al. | |
| 2004/0065894 | A1 * | 4/2004 | Hashimoto et al. | .......... 257/100 |
| 2004/0171189 | A1 | 9/2004 | Gaku et al. | |
| 2006/0043544 | A1 | 3/2006 | Tsukamoto et al. | |
| 2007/0023893 | A1 | 2/2007 | Shin et al. | |
| 2008/0185711 | A1 | 8/2008 | Hsu | |
| 2010/0001395 | A1 | 1/2010 | Wang et al. | |
| 2010/0044084 | A1 | 2/2010 | Lee et al. | |
| 2010/0072510 | A1 | 3/2010 | Lin et al. | |
| 2010/0072511 | A1 * | 3/2010 | Lin et al. | ........................ 257/99 |
| 2010/0164362 | A1 | 7/2010 | Miyakawa et al. | |

FOREIGN PATENT DOCUMENTS

| | | |
|---|---|---|
| JP | 2002-334895 A | 11/2002 |
| JP | 2006-073546 A | 3/2006 |
| JP | 2006-165114 A | 6/2006 |
| JP | 2006-318986 A | 11/2006 |
| JP | 2007-043155 A | 2/2007 |
| KR | 10-2008-0053048 A | 6/2008 |
| KR | 10-2008-0072542 A | 8/2008 |
| KR | 10-2010-0017841 A | 2/2010 |
| KR | 10-2010-0022351 A | 3/2010 |
| TW | I255001 B | 5/2006 |
| TW | M295795 U | 8/2006 |
| TW | M339772 U | 9/2008 |
| TW | 200945619 A | 11/2009 |

OTHER PUBLICATIONS

International Search Report in International Application No. PCT/KR2011/005218, filed Jul. 15, 2011.
Notice of Allowance dated May 30, 2012 in Korean Application No. 10-2010-0070187, filed Jul. 20, 2010.
Notice of Allowance dated May 18, 2012 in Korean Application No. 10-2010-0094630, filed Sep. 29, 2010.
European Search Report dated Jan. 14, 2015 in European Application No. 11809828.4.
Japanese Office Action dated Feb. 3, 2015 in Japanese Application No. 2013-520642.
Chinese Office Action dated Feb. 6, 2015 in Chinese Application No. 201180045286.X.

* cited by examiner (a)

(b)

(a)

(b)

(c)

(d)

[Figure 37]
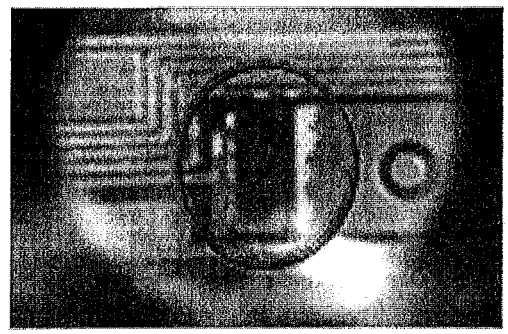
(a)
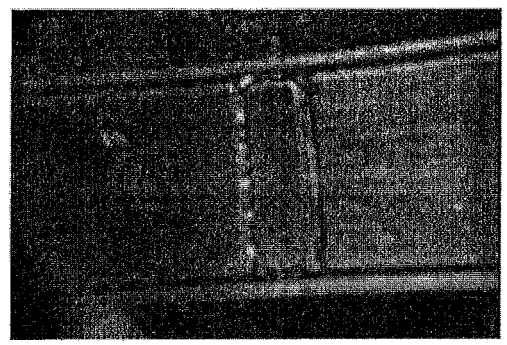
(b)

1

RADIANT HEAT CIRCUIT BOARD AND METHOD FOR MANUFACTURING THE SAME

CROSS-REFERENCE TO RELATED APPLICATIONS

This application is the U.S. national stage application of International Patent Application No. PCT/KR2011/005218, filed Jul. 15, 2011, which claims priority to Korean Application Nos. 10-2010-0070187, filed Jul. 20, 2010 and 10-2010-0094630, filed Sep. 29, 2010, the disclosures of each of which are incorporated herein by reference in their entirety.

TECHNICAL FIELD

The embodiment relates to a radiant heat circuit board and a method for manufacturing the same.

BACKGROUND ART

A circuit board refers to an electrical insulating substrate printed with circuit patterns, and is used to mount electronic components.

The electronic components may include heat emitting devices, for example, LEDs (Light Emitting Diodes), and the heat emitting devices emit a significant amount of heat. The heat emitted from the heat emitting devices increases the temperature of the circuit board, thereby causing malfunction of the heat emitting devices and degrading the reliability of the heat emitting devices.

In order to solve the problem caused by the emitted heat, a radiant heat circuit board shown in FIG. 1 has been suggested.

FIG. 1 is a sectional view showing a conventional radiant heat circuit board 1. Referring to FIG. 1, the radiant heat circuit board 1 includes a metallic plate 2, an insulating layer 3, a circuit pattern 4, and a mounting part 5 for a heat emitting device.

DISCLOSURE OF INVENTION

Technical Problem

In the above conventional radiant heat circuit board 1, the heat emitted from the heat emitting device is not transferred to the metallic plate 2 used for radiating heat due to the interference with the insulating layer 3.

Solution to Problem

The embodiment provides a radiant heat circuit board having a novel structure and a method for manufacturing the same.

The embodiment provides a radiant heat circuit board capable of improving thermal efficiency and a method for manufacturing the same.

According to the embodiment, there is provided a radiant heat circuit board, which is used to mount a heat emitting device thereon, includes a metallic plate including a metallic protrusion having a solder to which the heat emitting device is attached, a bonding layer on the metallic protrusion, an insulating layer on the metallic plate to expose the metallic protrusion, and a circuit pattern on the insulating layer.

According to the embodiment, there is provided a method for manufacturing a radiant heat circuit board, which includes forming a metallic plate including a metallic protrusion by processing a metallic base plate, forming a bonding layer by plating an alloy including Cu representing a high adhesive property with respect to a solder on the metallic protrusion, forming an insulating layer on the metallic plate to expose the metallic protrusion, and forming a circuit pattern on the insulating layer.

Advantageous Effects Of Invention

As described above, according to the embodiment, heat emitted from the heat emitting device can be directly transferred to the metallic plate by providing the metallic plate including a heat radiation protrusion under the mounting pad, so that heat radiation efficiency can be increased. In addition, the surface of the heat radiation protrusion is plated with an alloy including copper, thereby improving the adhesive property with respect to the solder, so that the failure rate can be reduced.

BRIEF DESCRIPTION OF DRAWINGS

FIG. 37A is a photograph showing a comparative group of the embodiment, and FIG. 37B is a photograph showing the top surface of the radiant heat circuit board of FIG. 20.

BEST MODE FOR CARRYING OUT THE INVENTION

Figure 1:
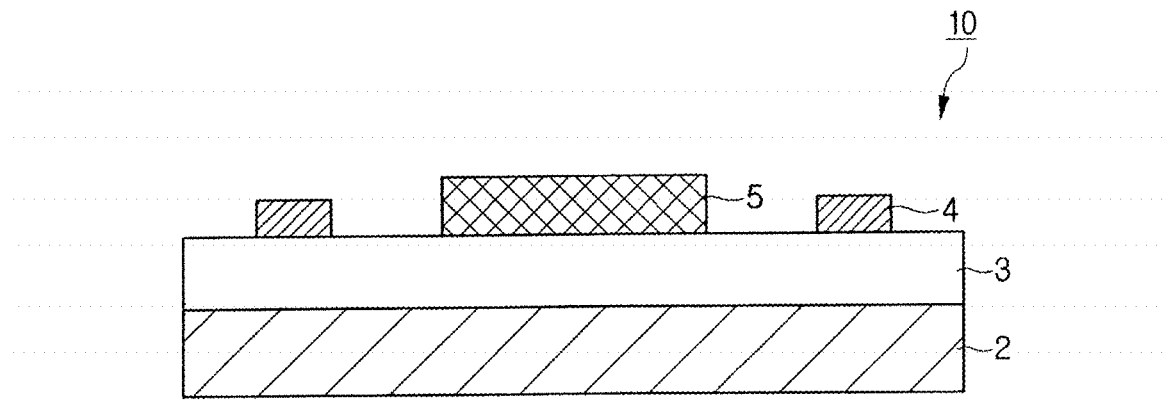
FIG. 1 is a sectional view showing a conventional radiant heat circuit board.

Hereinafter, the embodiments will be described with reference to accompanying drawings in detail so that those skilled in the art to which the invention pertains can easily realize the embodiments. However, the embodiments may have various modifications without limitation.

In the following description, when a part is referred to as it includes a component, the part may not exclude other components but further include another component unless the context indicates otherwise.

The thickness and size of each layer shown in the drawings may be exaggerated, omitted or schematically drawn for the purpose of convenience or clarity. In addition, the size of elements does not utterly reflect an actual size. In the following description, the similar components will be assigned with the similar reference numerals.

In the description of the embodiments, it will be understood that, when a layer (or film), a region, a pattern, or a structure is referred to as being 'on' or 'under' another substrate, another layer (or film), another region, another pad, or another pattern, it can be 'directly' or 'indirectly' on the other substrate, layer (or film), region, pad, or pattern, or one or more intervening layers may also be present.

The embodiment provides a circuit substrate using a metallic plate for the purpose of heat radiation, in which the circuit substrate includes heat radiation and solder bonding structures.

Hereinafter, a radiant heat circuit board 100 according to a first embodiment will be described with reference to FIGS. 2 to 10.

Figure 2:
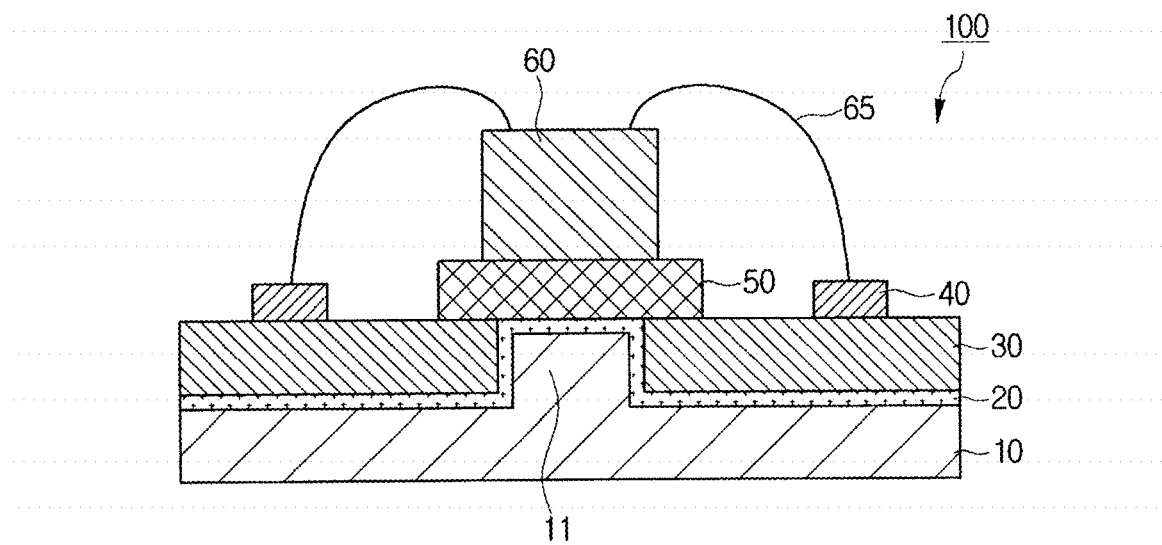
FIG. 2 is a sectional view showing a radiant heat circuit board according to a first embodiment.

FIG. 2 is a sectional view showing the radiant heat circuit board according to the first embodiment.

Referring to FIG. 2, the radiant heat circuit board 100 according to the first embodiment includes a metallic plate 10, a bonding layer 20 formed on the metallic plate 10, an insulating layer 30 formed on the bonding layer 20, and a circuit pattern 40 formed on the insulating layer 30.

The metallic plate 10 may include one of alloys including aluminum (Al), nickel (Ni), gold (Au), or platinum (Pt) representing superior thermal conductivity.

The metallic plate 10 includes a metallic protrusion 11 on which the heat emitting device 60 is mounted.

The metallic protrusion 11 protrudes from the metallic plate 10 perpendicularly to the metallic plate 10, and has a predetermined area so that a solder 50 used to mount the heat emitting device 60 thereon may be positioned on the top surface of the metallic plate 10.

The bonding layer 20 is formed on the metallic plate 10.

The bonding layer 20 increases the adhesive strength between the metallic protrusion 11 protruding from the metallic plate 10 and the solder 50, and may be a layer obtained by plating the metallic plate 10 with an alloy including copper (Cu), which is a material representing a superior adhesive property with respect to the solder 50, preferably, alloy including Cu or Ni.

The metallic plate 10 is provided thereon with the insulating layer 30.

The insulating layer 30 opens the metallic protrusion 11. The insulating layer 30 may include epoxy-based insulating material representing low thermal conductivity (about 0.2 W/mk to about 0.4 W/mk), or may include polyimide-based resin representing higher thermal conductivity.

As shown in FIG. 2, the insulating layer 30 may have a thickness equal to the height of the metallic protrusion 11 having the bonding layer 20 thereon, or may have a thickness less than the height of the metallic protrusion 11.

The insulating layer 30 may include a single layer or a plurality of layers. If the insulating layer 30 includes a plurality of layers, the layers may include materials different from each other.

The insulating layer 30 is provided thereon with a plurality of circuit patterns 40.

The circuit patterns 40 are formed by patterning a conductive layer stacked on the insulating layer 30.

The circuit patterns 40 may include a material representing high electrical conductivity and low resistance. Accordingly, the circuit patterns 40 may be formed by patterning a thin copper foil layer serving as the conductive layer.

The circuit patterns 40 may be plated with silver (Ag) or aluminum (Al) by using a thin copper layer as a seed layer.

Meanwhile, the metallic protrusion 11 of the metallic plate 10 serves as a mounting pad for the heat emitting device 60, and is provided thereon with the solder 50 used to mount the heat emitting device 60. The heat emitting device 60 is formed on the solder 50.

The solder 50 may be formed by performing heat treatment after coating a lead solder cream or a lead-free solder cream on the metallic protrusion 11 and mounting the heat emitting device 60 thereon.

The heat emitting device 60 on the metallic protrusion 11, for example, a light emitting device such as a light emitting diode package may be electrically connected to the circuit patterns 40 through the bonding of a wire 65. Meanwhile, the heat emitting device 60 may be mounted through flip-chip bonding.

As described above, the top surface of the metallic protrusion 11 is exposed outside through the insulating layer 30 to serve as a mounting pad for the heat emitting device 60. Accordingly, the heat emitting device 60 can be directly connected to the metallic plate 10 without an additional mounting pad, so that heat radiation property can be increased.

In addition, the surface of the metallic plate 10 including the metallic protrusion 11 is plated with an alloy including Cu or Ni representing superior adhesive strength with respect to the solder 50, thereby increasing the adhesive strength with the solder 50 when the metallic plate 10 includes metal other than Cu.

Accordingly, although the metallic plate 10 is formed by using Al having price lower than that of Cu, a heat radiation property and the adhesive property with the solder 50 can be ensured.

Hereinafter, a method for manufacturing the radiant heat circuit board 100 of FIG. 2 will be described with reference to FIGS. 3 to 16.

FIGS. 3 to 10 are sectional views showing a first method for manufacturing the radiant heat circuit board 100 of FIG. 2.

Figure 3:
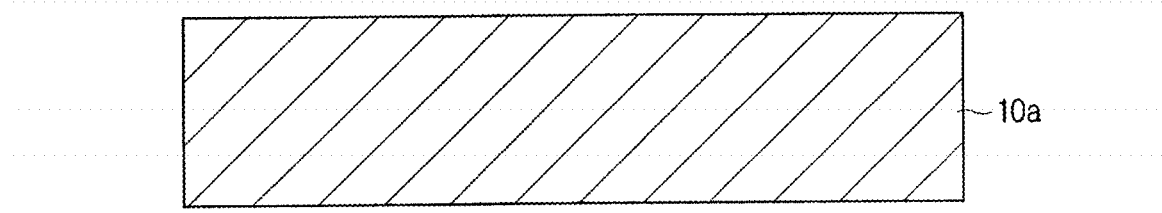
FIGS. 3 to 10 are sectional views showing a first method for manufacturing the radiant heat circuit board of FIG. 2.
Figure 4:
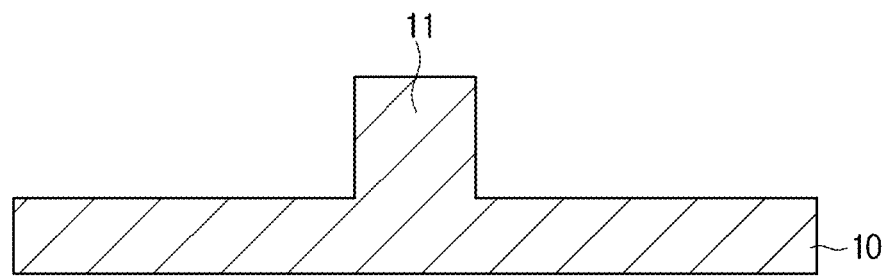

First, after preparing a metallic base plate 10a as shown in FIG. 3, the metallic protrusion 11 and the metallic plate 10 are formed by processing the metallic base plate 10a as shown in FIG. 4.

The metallic base plate 10a may include one of alloys including Al, Ni, Au, or Pt representing superior thermal conductivity. In addition, the metallic base plate 10a may include metal representing low adhesive strength with respect to the solder 50.

The metallic protrusion 11 may be formed through a molding process after a rolling process has been performed with respect to the metallic base plate 10a or may be formed by etching the metallic base plate 10a.

In this case, the height of the metallic protrusion 11 is determined based on the thickness of the insulating layer 30 so that the height of the metallic protrusion 11 may be equal to or greater than the thickness of the insulating layer 30 to be described later.

Figure 5:
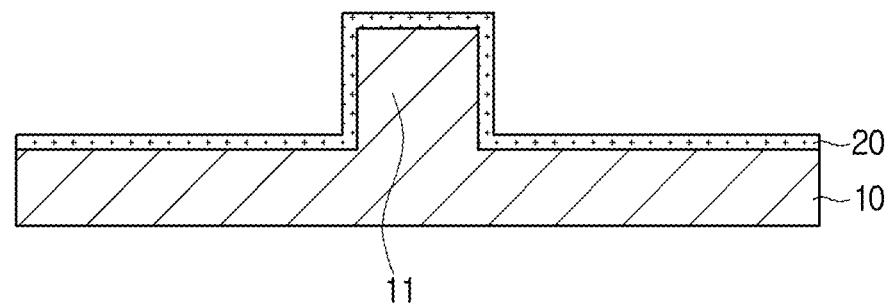

Next, the bonding layer 20 of FIG. 5 is formed on the surface of the metallic plate 10 and the metallic protrusion 11.

The bonding layer 20 may be formed by plating an alloy including Cu or Ni, or may be formed by plating an alloy including Cu or Ni after the surfaces of the metallic plate 10 and the metallic protrusion 11 have been chemically treated by using metal salt such as zincate.

Figure 6:
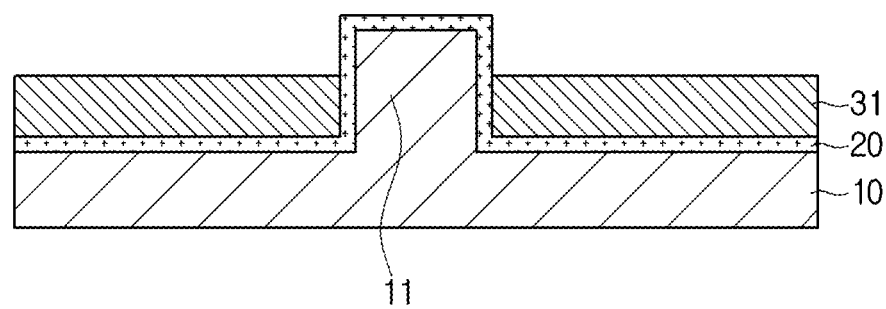

Subsequently, as shown in FIG. 6, a first insulating layer 31 is formed on the metallic plate 10.

The first insulating layer 31 may be formed by coating and hardening a prepreg including epoxy resin representing an insulating property.

The first insulating layer 31 is coated on the bonding layer 20 of the metallic plate 10 except for the metallic protrusion 11 so that the first insulating layer 31 has a thickness less than the height of the metallic protrusion 11.

Figure 7:
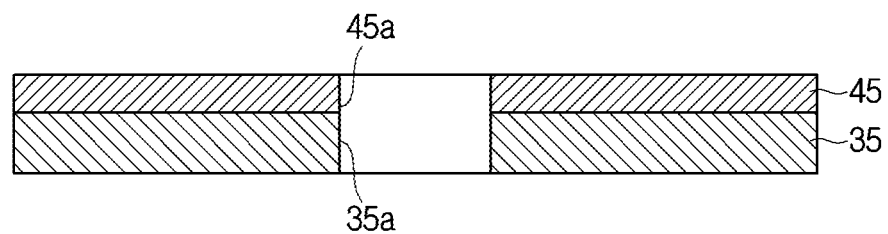

Next, a second insulating layer 35 including a copper foil layer 45 is prepared as shown in FIG. 7.

The sum of the thicknesses of the first and second insulating layers 31 and 35 may be equal to or less than the height of the metallic protrusion 11, and the second insulating layer 35 may include epoxy resin the same as that of the first insulating layer 31.

The stack structure of the copper foil layer 45 and the second insulating layer 35 of FIG. 7 may be a conventional CCL (Cupper Clad Laminate), or may be formed by coating the second insulating layer 35 in the paste state on the copper foil layer 45 and hardening the resultant structure.

The stack structure of the copper foil layer 45 and the second insulating layer 35 of FIG. 7 has predetermined openings 35*a* and 45*a*.

In other words, the second insulating layer 35 includes the insulating opening 35*a* having a size the same as the area of the metallic protrusion 11, and the copper foil layer 45 includes the copper foil opening 45*a* aligned in line with the insulating opening 35*a*.

The openings 35*a* and 45*a* may be formed through a mechanical process such as a drill process or a laser process.

Figure 8:
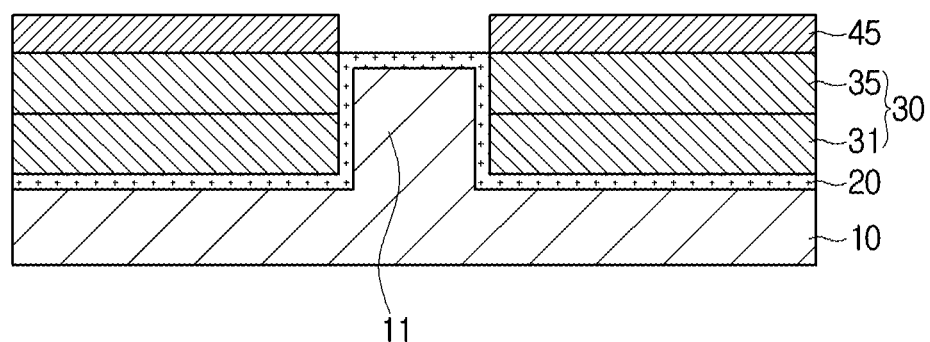

Next, as shown in FIG. 8, the insulating opening 35*a* is aligned to expose the metallic protrusion 11 protruding beyond the first insulating layer 31, and the structures of FIGS. 6 and 7 are integrated with each other through thermo-compression so that the second insulating layer 35 is positioned on the first insulating layer 31.

Therefore, the first and second insulating layers 31 and 35 form the insulating layer 30 of FIG. 2, and the thickness of the insulating layer 30 is equal to or lower than the height of the metallic protrusion 11.

Figure 9:
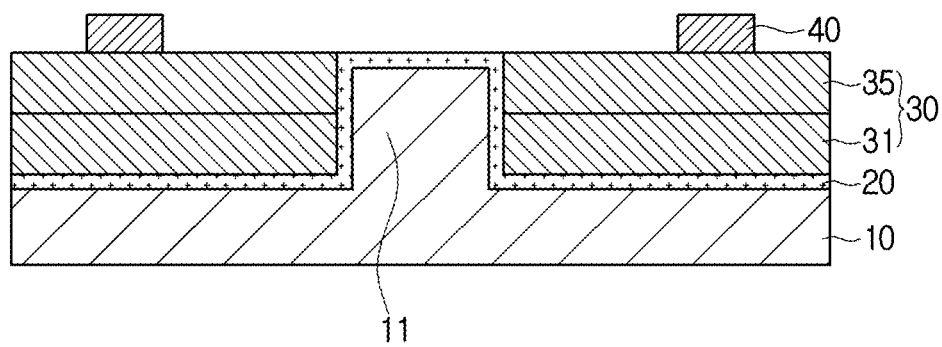

Next, as shown in FIG. 9, predetermined circuit patterns 40 are formed by etching the copper foil layer 45, and may be plated with Ag or Al.

Differently, after forming the circuit patterns 40 by etching the copper foil layer 45 in the stack structure of FIG. 7, the resultant structure may be thermally compressed with the structure of FIG. 6.

In the radiant heat circuit board 100 shown in FIG. 9, the insulating layer 30 is open, and the metallic protrusion 11 directly connected to the metallic plate 10 serves the mounting pad for the heat emitting device 60, so that heat emitted from the heat emitting device 60 is directly transferred to the metallic plate 10, thereby increasing thermal efficiency.

In the radiant heat circuit board 100 having the above structure, the surface of the metallic protrusion 11 is plated with a material including Cu to increase an adhesive property with respect to the heat emitting device 60.

Figure 10:
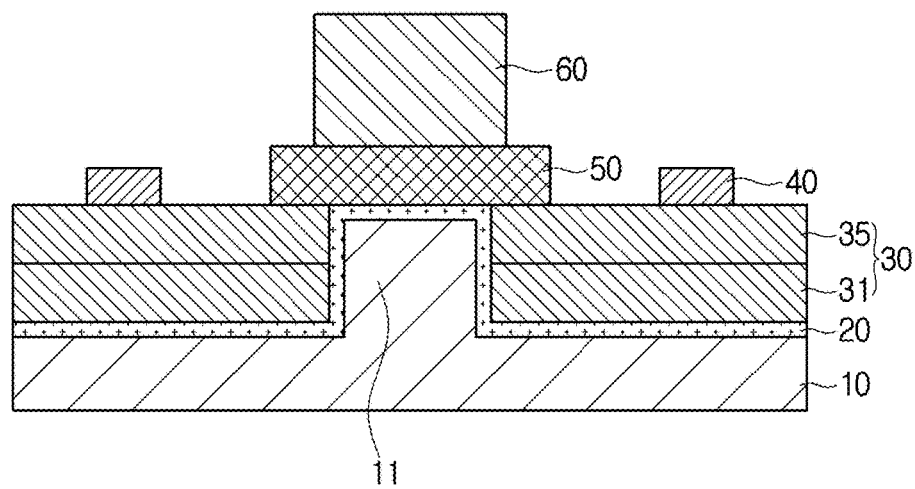

As described above, the bonding layer 20 having a surface plated with Cu is formed. Thus, after coating the cream of the solder 50 on the bonding layer 20 on the surface of the metallic protrusion 11 as shown in FIG. 10, the heat emitting device 60 is mounted on the cream of the solder 50. Thereafter, the cream of the solder 50 and the bonding layer 20 is combined with each other through heat treatment, thereby firmly bonding the heat emission device 60 on the solder 50.

The above radiant heat circuit board is used in a light source for a backlight unit or a light source for lighting. In particular, when the radiant heat circuit board having a light emitting diode package emitting a significant amount of heat is used in a light source for a backlight unit or a light source for lighting, the radiant heat circuit board discharges heat emitted from the light emitting diode package to the outside through the metallic protrusion 11, thereby representing high heat radiation efficiency and a superior adhesive property with respect to a device even if a substrate including metal other than Cu is employed.

Meanwhile, the radiant heat circuit board 100 of FIG. 2 may be formed through a method different from that of FIGS. 3 to 10.

Hereinafter, a method for manufacturing the radiant heat circuit board 100 of FIG. 2 will be described with reference to FIGS. 11 to 16.

Figure 11:
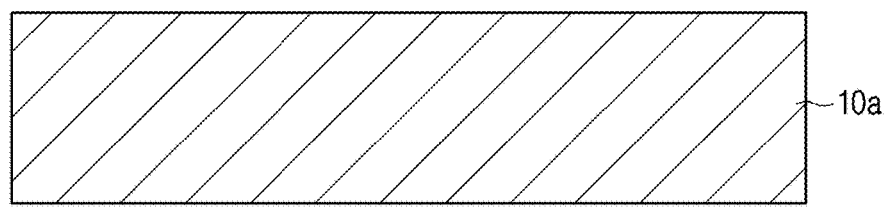
FIGS. 11 to 16 are sectional views showing a second method for manufacturing the radiant heat circuit board of FIG. 2.
Figure 12:
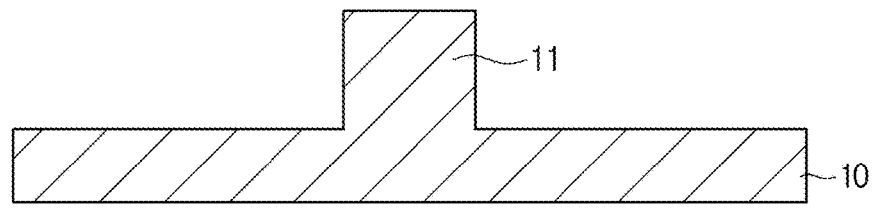

After preparing the metallic base plate 10*a* of FIG. 11, the metallic protrusion 11 and the metallic plate 10 are formed by processing the metallic base plate 10*a* as shown in FIG. 12.

The metallic base plate 10*a* may include one of alloys including Al, Ni, Au, or Pt representing superior thermal conductivity, or may include metal representing low adhesive strength with the solder 50.

The metallic protrusion 11 may be formed by molding the metallic base plate 10*a* through a rolling process or by etching the metallic base plate 10*a*.

In this case, the height of the metallic protrusion 11 is determined based on the thickness of the insulating layer 30 so that the height of the metallic protrusion 11 may be equal to or greater than the thickness of the insulating layer 30 to be described later.

Figure 13:
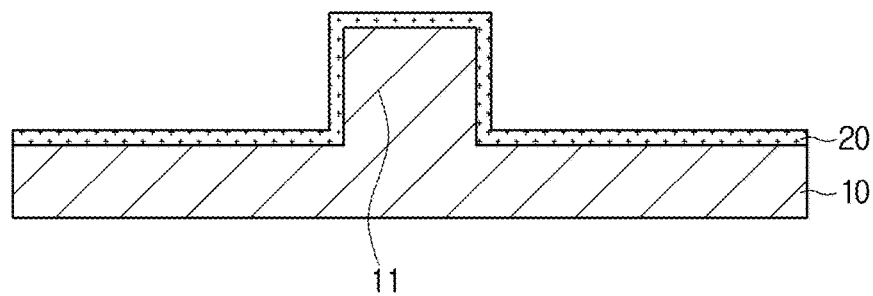

Next, as shown in FIG. 13, the bonding layer 20 is formed on the surfaces of the metallic plate 10 and the metallic protrusion 11.

The bonding layer 20 may be formed by plating an alloy including Cu or Ni on the surfaces of the metallic plate 10 and the metallic protrusion 11, or may be formed by plating alloy including Cu or Ni on the surfaces of the metallic plate 10 and the metallic protrusion 11 after chemically treating the surfaces of the metallic plate 10 and the metallic protrusion 11 by using metal salt such as zincate.

Figure 14:
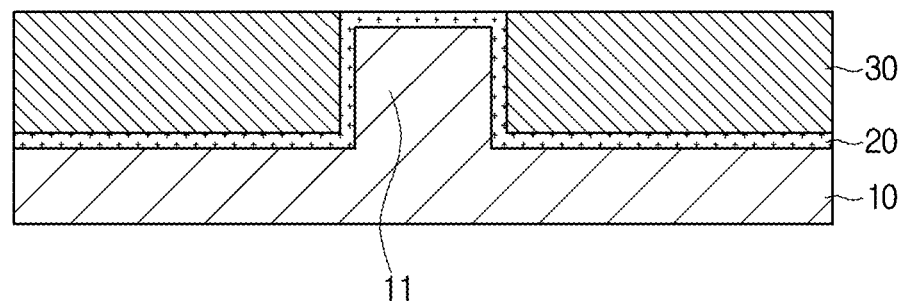

Next, as shown in FIG. 14, the insulating layer 30 is formed on the metallic plate 10.

The insulating layer 30 is formed by coating an insulating material including epoxy resin at the thickness equal to or less than the height of the metallic protrusion 11 in such a manner that the metallic protrusion 11 is exposed.

Figure 15:
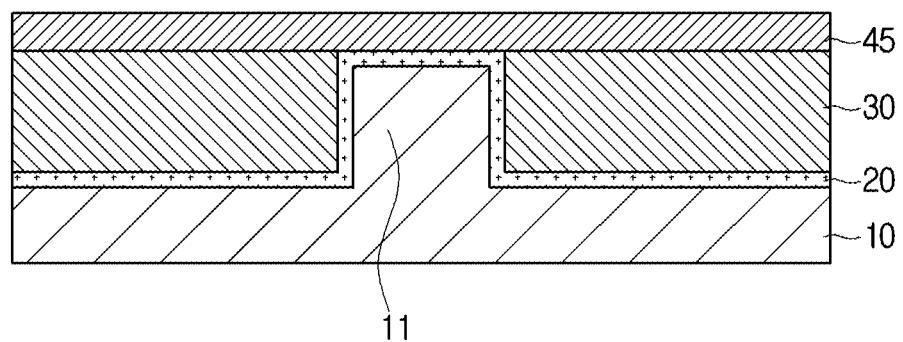

Next, as shown in FIG. 15, the copper foil layer 45 is formed on the insulating layer 30, and the insulating layer 30 is cured through thermo-compression.

In this case, if the metallic protrusion 11 protrudes beyond the insulating layer 30, the copper foil layer 45 may have a hole (not shown) having the same size as the area of the metallic protrusion 11 to expose the metallic protrusion 11.

Figure 16:
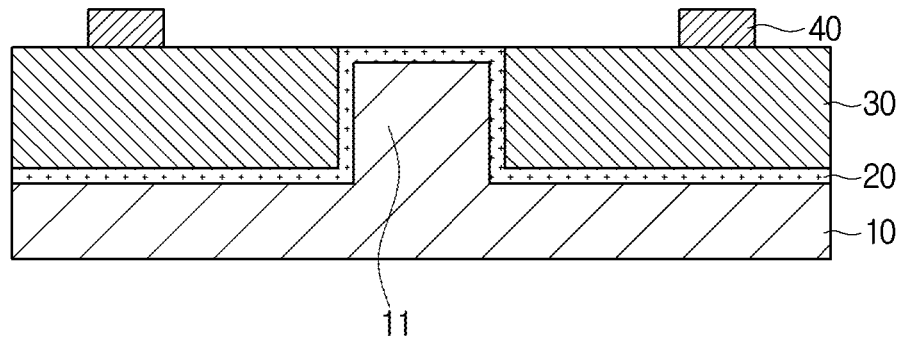

Subsequently, as shown in FIG. 16, the predetermined circuit patterns 40 are formed by etching the copper foil layer 45, and the circuit patterns 40 may be plated with Ag or Al.

In this case, if the copper foil layer 45 covers the upper portion of the metallic protrusion 11, the copper foil layer 45 is etched to expose the metallic protrusion 11 when the circuit patterns 40 are formed.

According to the second method, the insulating layer 30 includes one layer, and the copper foil layer 45 is directly formed on the insulating layer 30, so that the number of the manufacturing processes can be reduced.

In the radiant heat circuit board 100 shown in FIG. 16, the insulating layer 30 is exposed, and the metallic protrusion 11 directly connected to the metallic plate 10 serves the mounting pad for the heat emitting device 60, so that heat emitted from the heat emitting device 60 is directly transferred to the metallic plate 11, thereby increasing thermal efficiency.

In the radiant heat circuit board 100 having the above structure, the surface of the metallic protrusion 11 is plated with a material including Cu to increase an adhesive property with respect to the heat emitting device 60.

As described above, the bonding layer 20 having a surface plated with Cu is formed. Thus, after coating the cream of the solder 50 on the bonding layer 20 on the surface of the metallic protrusion 11 as shown in FIG. 2, the heat emitting device 60 is mounted on the cream of the solder 50. Thereafter, the cream of the solder 50 and the bonding layer 20 is combined with each other through heat treatment, thereby firmly bonding the heat emission device 60 on the solder 50.

Hereinafter, a radiant heat circuit board 200 according to another embodiment will be described with reference to FIG. 17.

Figure 17:
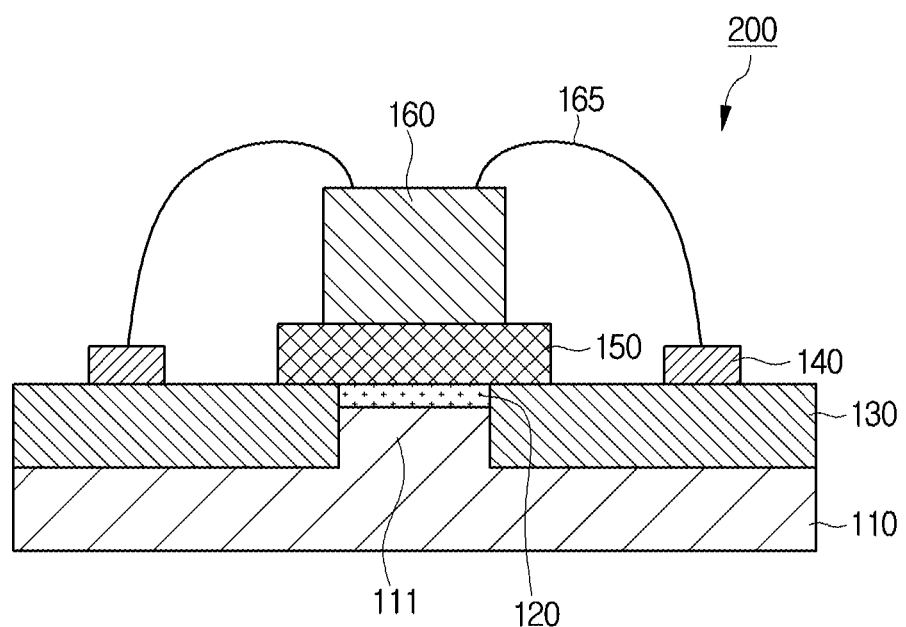
FIG. 17 is a sectional view showing a radiant circuit board according to a second embodiment.
Figure 18:
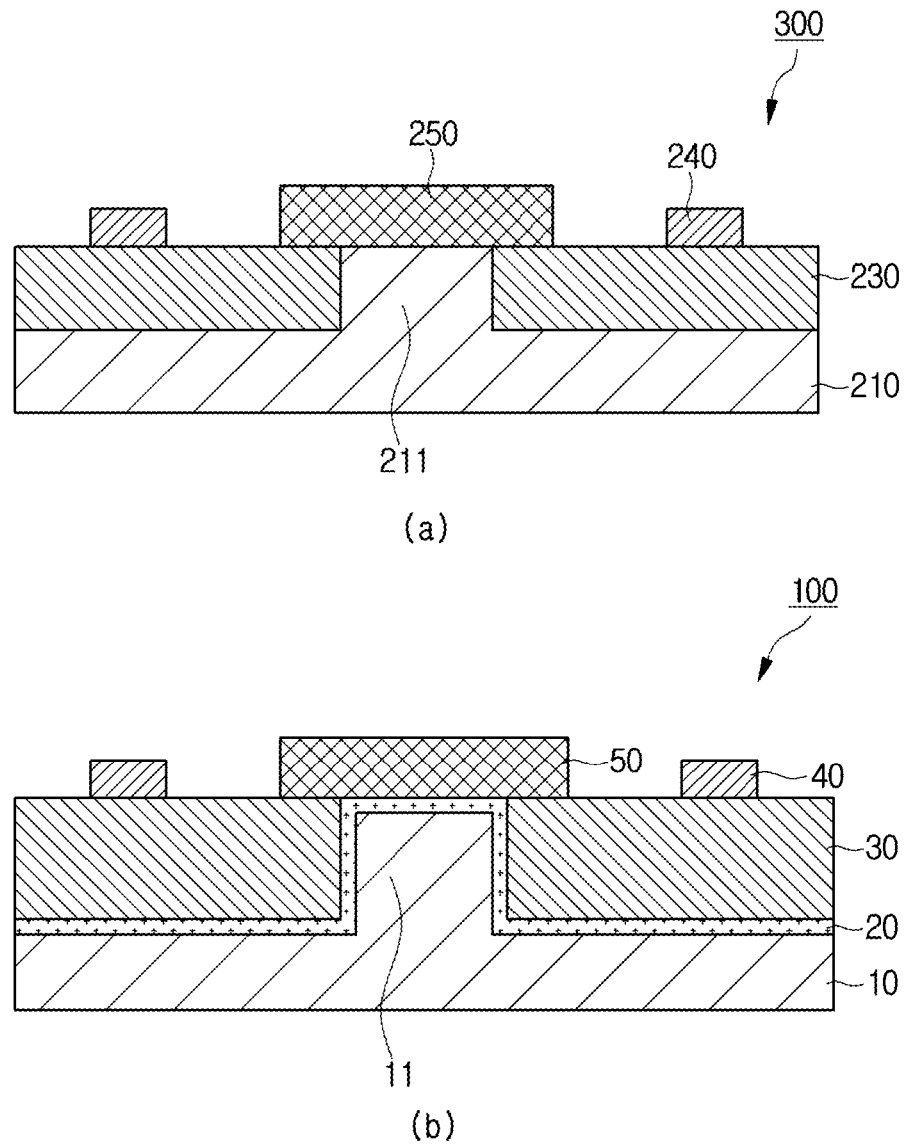
FIG. 18A shows the structure of a comparative group of the embodiment.
FIGS. 18B shows the structure of an experimental group according to the embodiment.
Figure 19:
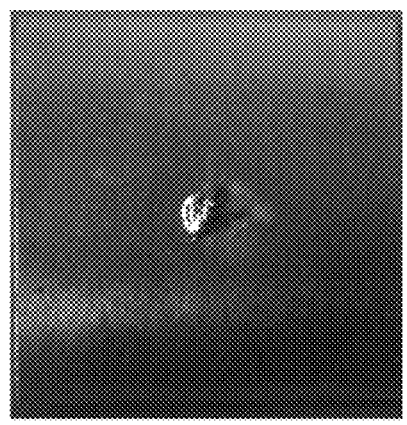
FIGS. 19A and 19B are photographs showing the state change of the comparative group.
FIGS. 19C and 19D are photographs showing the state change of the experimental group.
Figure 19:
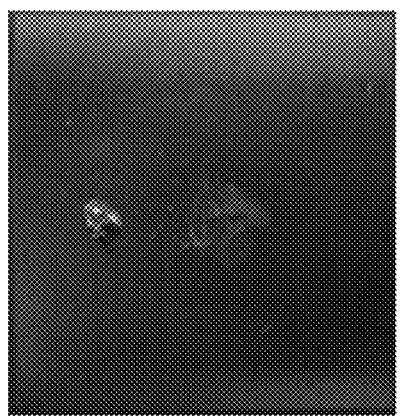
Figure 19:
Figure 19:

FIG. 17 is a sectional view showing the radiant heat circuit board 200 according to a second embodiment.

Referring to FIG. 17, the radiant heat circuit board 200 according to the second embodiment includes a metallic plate 110, a bonding layer 120 formed on the metallic plate 110, an insulating layer 130 formed on the bonding layer 120, and a circuit pattern 140 formed on the insulating layer 130.

The metallic plate 110 may include one of alloys including Al, Ni, Au, and Pt representing superior thermal conductivity.

The metallic plate 110 includes a metallic protrusion 111 on which a heat emitting device 160 is mounted.

The metallic protrusion 111 protrudes from the metallic plate 110 perpendicularly to the metallic plate 10, and has a predetermined area so that a solder 150 used to mount the heat emitting device 160 thereon may be positioned on the top surface of the metallic plate 110.

The bonding layer 120 is selectively formed only on the top surface of the metallic protrusion 111.

The bonding layer 120 increases the adhesive strength between the metallic protrusion 111 protruding from the metallic plate 110 and the solder 150, and may be a layer obtained by selectively plating the metallic protrusion 111 with an alloy including copper (Cu), which is a material representing a superior adhesive property with respect to the solder 150, preferably, an alloy including Cu or Ni.

The insulating layer 130 is formed on the metallic plate 110.

The insulating layer 130 opens the metallic protrusion 111. The insulating layer 130 may include epoxy insulating resin representing low thermal conductivity (about 0.2 W/mk to about 0.4 W/mk), or may include polyimide resin representing higher thermal conductivity.

The insulating layer 130 may have a thickness equal to the height of the metallic protrusion 111 having the coating layer, or may have a thickness less than the height of the metallic protrusion 111.

The insulating layer 130 may include a single layer, or may include a plurality of layers. If the insulating layer 130 includes a plurality of layers, the layers may include materials different from each other.

The insulating layer 130 is provided thereon with a plurality of circuit patterns 140.

The circuit patterns 140 are formed by patterning a conductive layer stacked on the insulating layer 130.

The circuit patterns 140 may include a material representing high conductivity and low resistance. Accordingly, the circuit patterns 40 may be formed by patterning a copper foil layer serving as a conductive layer.

The circuit patterns 140 may be plated with Ag or Al by using a thin copper layer as a seed layer.

Meanwhile, the metallic protrusion 111 of the metallic plate 110 serves as a mounting pad for the heat emitting device 160, and is provided thereon with the solder 150 used to mount the heat emitting device 160. The heat emitting device 160 is formed on the solder 150.

The solder 150 may be formed by performing heat treatment after coating a lead solder cream or a lead-free solder cream on the metallic protrusion 111 and mounting the heat emitting device 160 thereon.

The heat emitting device 160 on the metallic protrusion 111, for example, a light emitting device such as a light emitting diode package may be electrically connected with the circuit pattern 140 through the bonding of the wire 165.

As described above, the top surface of the metallic protrusion 111 is exposed outside through the insulating layer 130 to serve as a mounting pad for the heat emitting device 160. Accordingly, the heat emitting device 160 can be directly connected to the metallic plate 10 without an additional mounting pad, so that heat radiation property can be increased.

In addition, the surface of the metallic protrusion 111 is plated with an alloy including Cu or Ni representing superior adhesive strength with the solder 150, thereby increasing the adhesive strength with the solder 150 when the metallic plate 110 includes metal other than Cu.

Accordingly, although the metallic plate 110 is formed by using Al having price lower than that of Cu, a heat radiation property and the adhesive property with the solder 150 can be ensured. In addition, the bonding layer 120 is selectively formed on the metallic protrusion 111, thereby reducing the manufacturing cost.

Naturally, the radiant heat circuit board 200 shown in FIG. 17 can be manufactured through the manufacturing method that has been described with reference to FIGS. 3 to 16.

Hereinafter, the effects of the bonding layer 20 of a radiant heat circuit board according to the embodiment will be described with reference to FIGS. 18A to 19C.

FIG. 18A shows the structure of a comparative group of the embodiment, and FIGS. 18B shows the structure of an experimental group according to the embodiment. FIGS. 19A and 19B are photographs showing the state change of the comparative group; and FIGS. 19C and 19D are photographs showing the state change of the experimental group;

Similarly to the structure shown in FIG. 2, a radiant heat circuit board 300 belonging to the comparative group of FIG. 18A includes an aluminum plate 210 including a metallic protrusion 211, an insulating layer 230, and circuit patterns 240 formed on the insulating layer 230, and includes a solder 250 formed on the metallic protrusion 211.

FIG. 19A is a photograph showing the top surface of the radiant heat circuit board 300 of FIG. 18A. The solder 240 is separated from the metallic protrusion 211 as shown in FIG. 19B after the predetermined time elapses.

Since the metallic protrusion 211 includes an alloy including Al without Cu, the metallic protrusion 211 may not be combined with the solder 250 in the form of an alloy, so the adhesive strength is lowered.

Hereinafter, the radiant heat circuit board 100 according to the embodiment will be described with reference to FIGS. 18B, 19C and 19D. As shown in FIG. 18B, in the radiant heat circuit board 100 shown in FIG. 2, the aluminum plate 10 is used, and the bonding layer 20 is formed on the aluminum plate 10 by plating the surface of the metallic protrusion 11 with an alloy including Cu.

As shown in FIG. 19C, even if a predetermined time elapses after the solder 50 has been formed on the metallic protrusion 11, the solder 50 is not separated from the metallic protrusion 11, but bonded to the bonding layer 20 on the surface of the metallic protrusion 11 in the form of an alloy.

As described above, according to the embodiment, a heat radiation protrusion is formed by using a metallic plate without Cu, thereby ensuring thermal efficiency and economic properties. Meanwhile, an alloy including Cu is plated on the surface of the metallic protrusion used as the mounting pad for the heat emitting device, thereby increasing the adhesive property with respect to the solder.

Hereinafter, the radiant heat circuit board 300 according to the third embodiment will be described with reference to FIGS. 20 to 27.

Figure 20:
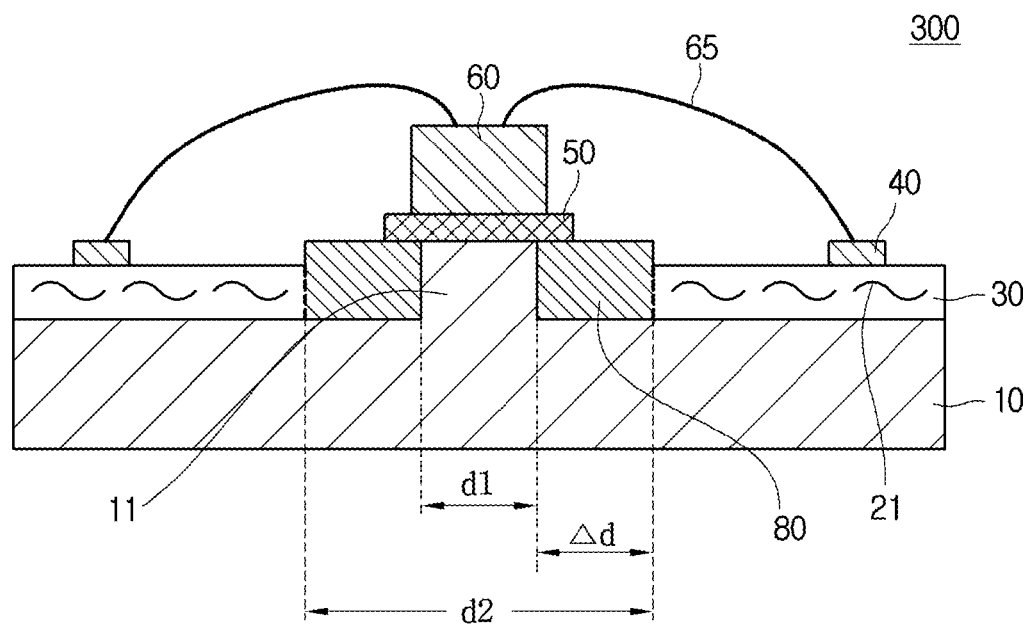
FIG. 20 is a sectional view showing a radiant circuit board according to a third embodiment.

FIG. 20 is a sectional view showing the radiant heat circuit board 300 according to the third embodiment.

Referring to FIG. 20, the radiant heat circuit board 300 according to the third embodiment includes the metallic plate 10, the insulating layer 30 formed on the metallic plate 10, and the circuit pattern 40 formed on the insulating layer 30.

Hereinafter, components of the third embodiment identical to those of the first embodiment will be not further described.

The metallic plate 10 includes the metallic protrusion 11 on which the heat emitting device 60 is mounted.

The metallic protrusion 11 protrudes from the metallic plate 10 perpendicularly to the metallic plate 10, and formed with a first width d1 so that the metallic protrusion 11 has a predetermined area to place the solder 50 used to mount the heat emitting device 60 on the top surface thereof.

The insulating layer 30 is formed on the metallic plate 10.

The insulating layer 30 may be formed by hardening a prepreg formed by infiltrating the solid component 21 such as tempered glass, glass fiber, or filler into epoxy resin.

A lateral-surface insulating layer 80 is formed at a predetermined thickness Δd closely to the metallic protrusion 11 while surrounding the lateral surfaces of the metallic protrusion 11.

In this case, the lateral-surface insulating layer 80 may have various thicknesses Δd about the metallic protrusion 11.

The lateral-surface insulating layer 80 extends from the insulating layer 30 and has a height equal to that of the metallic protrusion 11. The lateral-surface insulating layer 80 does not include the solid component 21 of the insulating layer 30, but includes only resin.

As shown in FIG. 20, the lateral-surface insulating layer 80 includes only resin and surrounds the metallic protrusion 11. The lateral-surface insulating layer 80 is formed at the predetermined thickness Δd to have the second width d2 instead of the first width d1. The insulating layer 30 extends together with the lateral-surface insulating layer 80, and includes both the solid component 21 and the resin on the flat surface of the metallic plate 10.

In this case, the distance between the solid component 21 of the insulating layer 30 and the lateral-surface insulating layer 80 is about 100 μm or less.

The insulating layer 30 may have a thickness equal to or less than the height of the metallic protrusion 11, or may have a thickness less than the height of the metallic protrusion 11 as shown in FIG. 2, so that the insulating layer 30 may be lower than the lateral-surface insulating layer 80.

The circuit patterns 40 are formed on the insulating layer 30.

The circuit patterns 40 may be formed by patterning conductive layers stacked on the insulating layer 30, and may be lower than the metallic protrusion 11.

Meanwhile, the metallic protrusion 11 of the metallic plate 10 serves as the mounting pad for the heat emitting device 60, and provided thereon with the solder 50 used to mount the heat emitting device 60. The heat emitting device 60 is formed on the solder 50.

The lateral-surface insulating layer 80 extends from the insulating layer 30 while surrounding the lateral surfaces of the metallic protrusion 11, thereby ensuring an electrical insulating property between the metallic protrusion 11 and the circuit patterns 40 adjacent to the metallic protrusion 11.

Hereinafter, a method for manufacturing the radiant heat circuit board 300 of FIG. 20 will be described with reference to FIGS. 21 to 34.

Figure 21:
FIGS. 21 to 27 are sectional views showing the first method for manufacturing the radiant heat circuit board of FIG. 20.
Figure 22:
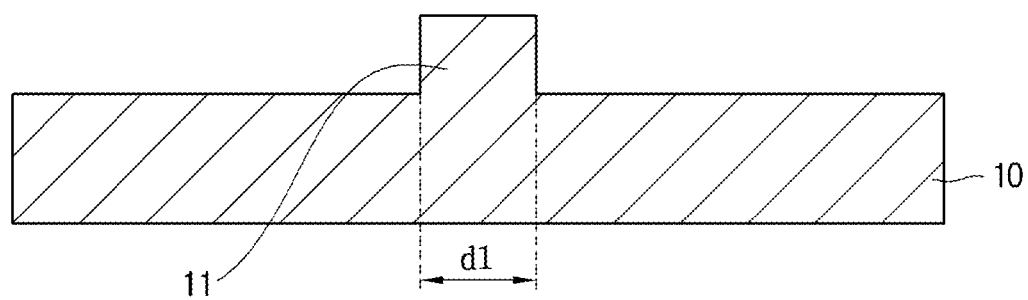

First, after preparing the metallic base plate 10a as shown in FIG. 21, the metallic protrusion 11 and the metallic plate 10 are formed by processing the metallic base plate 10a as shown in FIG. 22.

The metallic protrusion 11 has the first width d1. The metallic protrusion 11 may be formed by molding the metallic base plate 10a through a rolling process or by etching the metallic base plate 10a.

Figure 23:
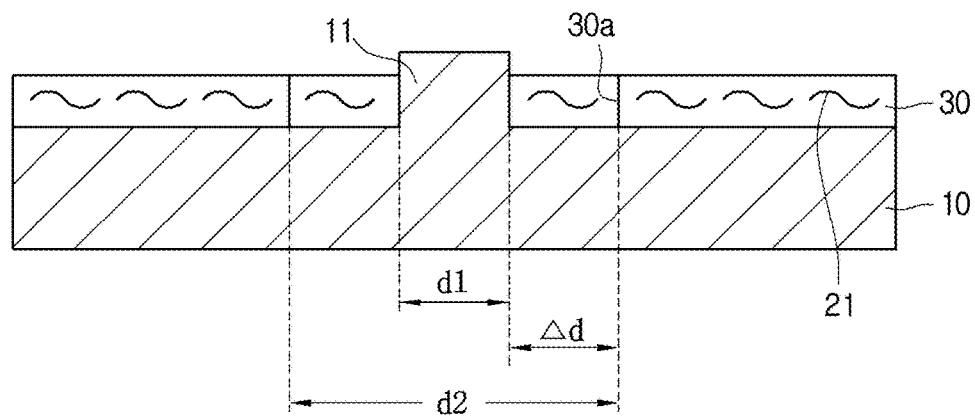

Next, the insulating layer 30 is formed on the metallic plate 10 as shown in FIG. 23.

The insulating layer 30 may be formed by coating a prepreg, in which the solid component 21 such as tempered glass, glass fiber, or filler is infiltrated into epoxy resin, on the metallic plate 10.

At this time, the prepreg has an opening 30a to expose the metallic protrusion 11.

The opening 30a has the second width d2 greater than the first width d1 of the metallic protrusion 11, and the distance Δd from the lateral surface of the opening 30a to the metallic protrusion 11 satisfies the following equation.

$$\Delta d = (d2 - d1)/2 \quad \text{Equation}$$

The distance Δd is equal to the thickness of the lateral-surface insulating layer 80 formed by the prepreg that surrounds the lateral surfaces of the metallic protrusion 11 while flowing toward the metallic protrusion 11 due to the thermo-compression of the resin of the prepreg when the stack structure including the copper foil layer 45 stacked on the prepreg is thermally compressed.

In this case, the prepreg may have various distances Δd from the metallic protrusion 11 due to the fine alignment error occurring when the opening 30a of the prepreg is aligned with the metallic protrusion 11.

Meanwhile, the second width d2 of the opening 30a may have a size corresponding to at least 80 times greater than the thickness of the prepreg, or may have various sizes according to the temperature and the pressure in the thermo-compression.

Figure 24:
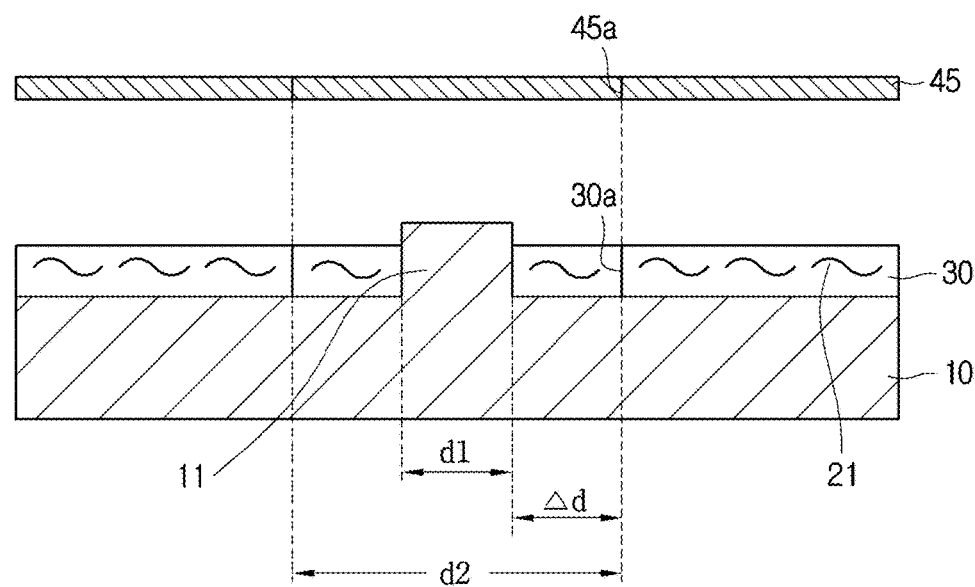

Next, as shown in FIG. 24, the copper foil layer 45 is prepared.

The copper foil layer 45 of FIG. 24 has the copper foil opening 45a.

In other words, the copper foil layer 45 includes the copper foil opening 45a having the second width d2 equal to the width of the opening 30a of the insulating layer 30.

The copper foil opening 45a may be formed through a mechanical process, that is, a drilling process, or a laser process.

Figure 25:
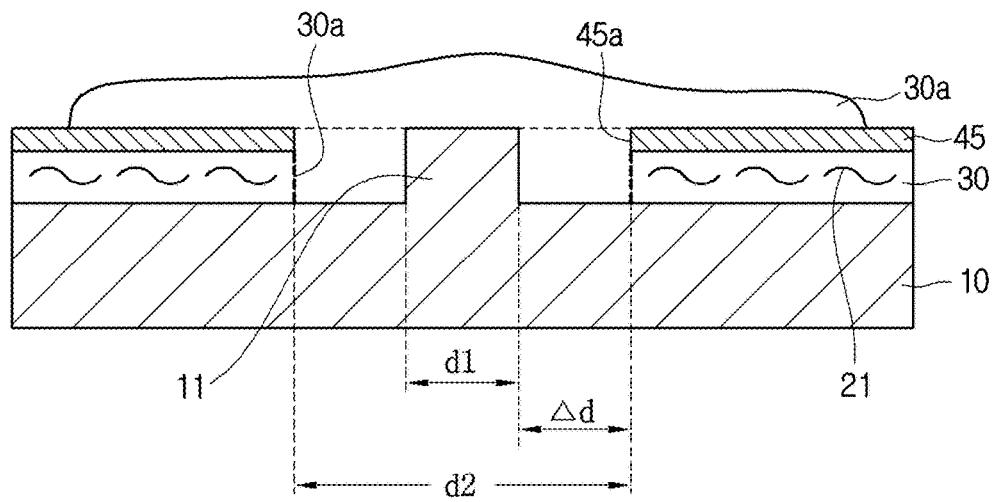

Next, as shown in FIG. 25, the copper foil layer 45 is integrated with the insulating layer 30 through the thermo-compression in such a manner that the copper foil layer 45 is provided on the insulating layer 30 so that the copper foil opening 45a can expose the metallic protrusion 11 protruding beyond the insulating layer 30.

Accordingly, the thickness of the insulating layer 30 is equal to or lower than the height of the metallic protrusion 11.

In this case, the prepreg constituting the insulating layer 30 is hardened due to the thermo-compression for the copper foil layer 45 and the metallic plate 10, and resin flows from the prepreg to the metallic protrusion 11 by the pressure in the thermo-compression, so that the resin may be filled in the opening 30a of the insulating layer 30 and the copper foil opening 45a.

The resin of the prepreg filled in the opening 30a of the insulating layer 30 and the opening 45a of the copper foil layer 45 is hardened, thereby forming the lateral-surface insulating layer 80 surrounding the metallic protrusion 11 while extending from the insulating layer 30, and the insulating layer 30 including the mixture of the resin and the solid component 21 is hardened other than the lateral-surface insulating layer 80.

Figure 26:
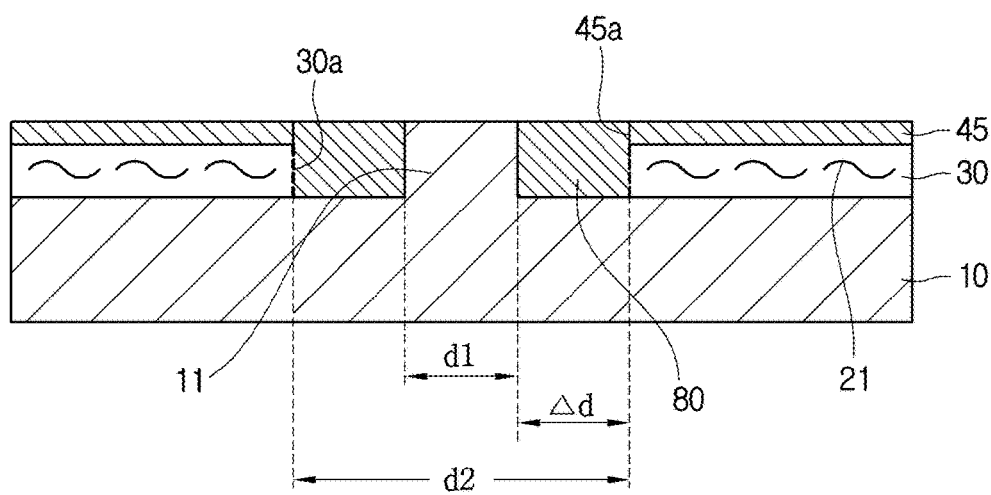

In this case, as shown in FIG. 25, if a portion 80 of the resin covers the top surfaces of the metallic protrusion 11 and the copper foil layer 45, the resin is removed to expose the top surfaces of the metallic protrusion 11 and the copper foil layer 45 as shown in FIG. 26. The process to expose the top surfaces of the metallic protrusion 11 and the copper foil layer 45 may be performed through a de-smear process to remove a smear of the insulating layer 30.

Figure 27:
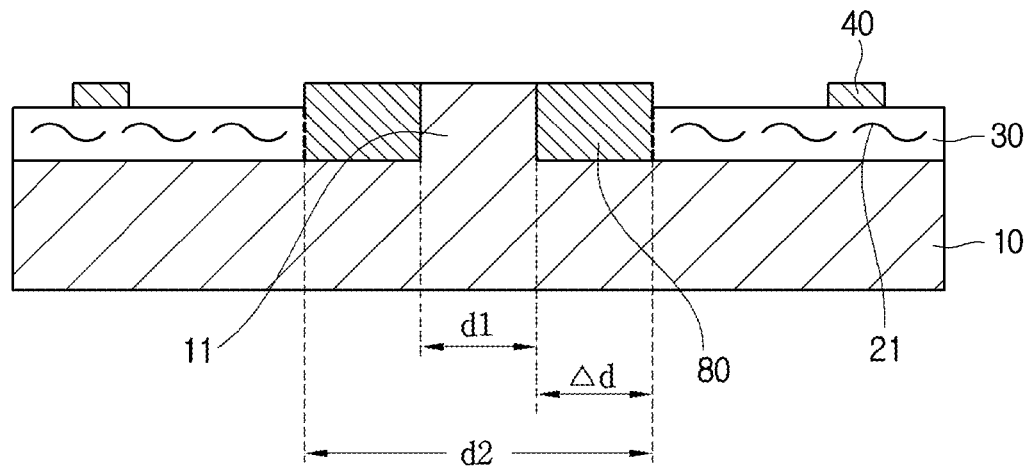

Next, as shown in FIG. 27, the circuit patterns 40 are formed by etching the copper foil layer 45, and the circuit patterns 40 may be plated with Ag or Al.

Figure 28:
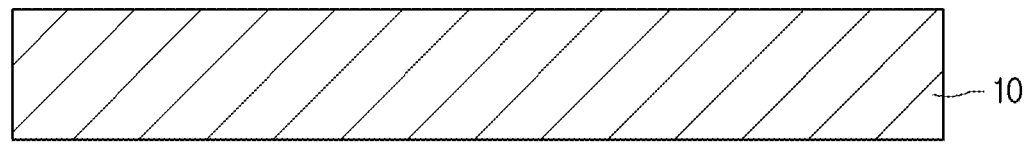
FIGS. 28 to 34 are sectional views showing the second method for manufacturing the radiant heat circuit board of FIG. 20.

In the radiant heat circuit board 300 shown in FIG. 28, the insulating layer 30 is exposed, and the metallic protrusion 11 directly connected to the metallic plate 10 serves the mounting pad of the heat emitting device 60, so that heat emitted from the heat emitting device 60 is directly transferred to the metallic plate 11, thereby increasing thermal efficiency.

When manufacturing the radiant heat circuit board 300 having the above structure, after forming the insulating layer 30 having the opening 30a greater than the metallic protrusion 11, the insulating layer 30 is thermally compressed to allow the resin of the insulating layer 30 to flow, so that the lateral-surface insulating layer 80 can be formed.

Accordingly, the electric insulating property between the metallic protrusion 11 and the circuit patters 40 adjacent to the metallic protrusion 11 can be ensured by the lateral-surface insulating layer 80.

The above radiant heat circuit board 300 is used in a light source for a backlight unit or a light source for lighting. In particular, when the radiant heat circuit board having a light emitting diode package emitting a significant amount of heat is used in a light source for a backlight unit or a light source for lighting, the area of the top surface of the metallic protrusion 11 to discharge heat emitted from the light emitting diode package to the outside through the metallic protrusion 11, thereby increasing heat radiation and adhesive properties. In addition, the insulating property can be ensured by the lateral-surface insulating layer 80, thereby increasing reliability.

Meanwhile, the radiant heat circuit board 300 of FIG. 20 may be formed through another method.

Hereinafter, another method for manufacturing the radiant heat circuit board 300 of FIG. 20 will be described with reference to FIGS. 28 to 34.

Figure 29:
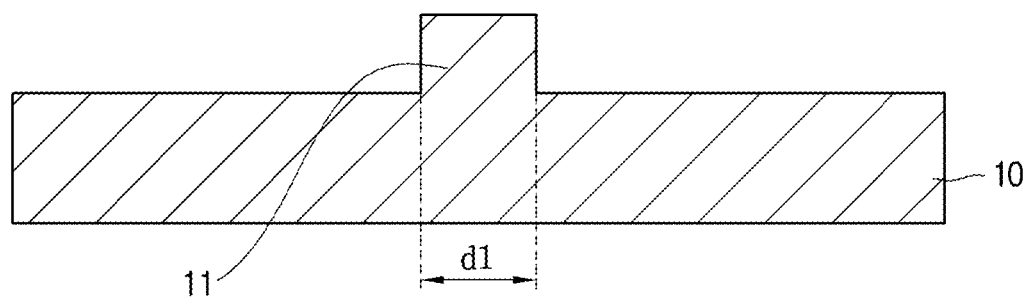

First, after preparing the metallic base plate 10a as shown in FIG. 28, the metallic protrusion 11 and the metallic plate 10 are formed by processing the metallic base plate 10a as shown in FIG. 29.

In this case, the metallic base plate 10a may include one of alloys including Cu, Al, Ni, Au, and Pt representing superior thermal conductivity.

The metallic protrusion 11 may be formed through a molding process after a rolling process has been performed with respect to the metallic base plate 10a or may be formed by etching the metallic base plate 10a.

In this case, the height of the metallic protrusion 11 is determined based on the thickness of the insulating layer 30 to be described later so that the height of the metallic protrusion 11 may be equal to or greater than the thickness of the insulating layer 30.

Figure 30:
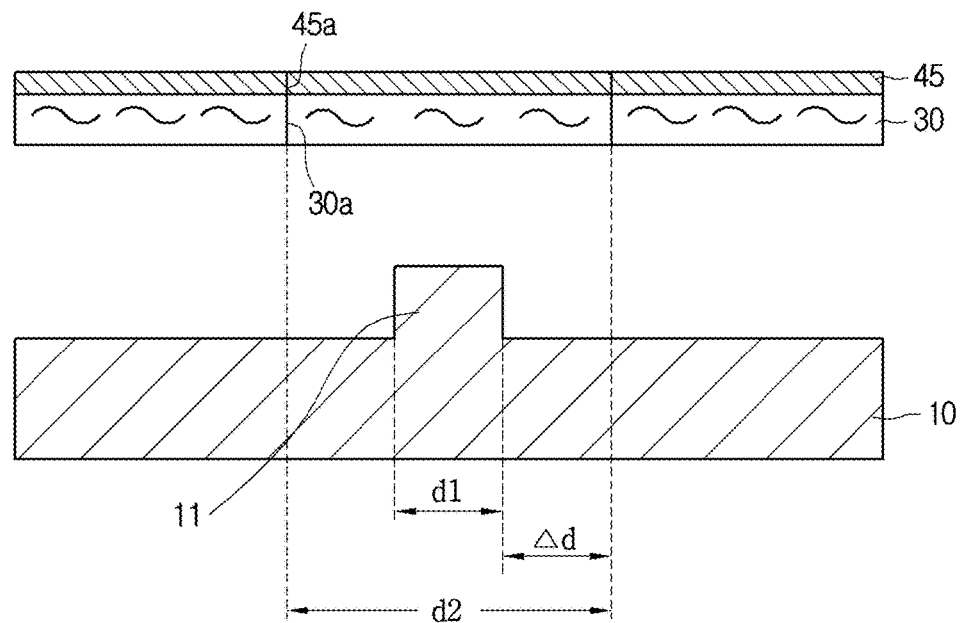

Subsequently, the insulating layer 30 including the copper foil layer 45 is prepared as shown in FIG. 30.

The structure of the insulating layer 30 including the copper foil layer 45 may be a conventional CCL (Cupper Clad Laminate) or may be formed by coating the insulating layer 30 in the paste state on the copper foil layer 45.

The insulating layer 30 may include a prepreg formed by infiltrating the solid component 21 such as tempered glass, glass fiber, or filler into epoxy resin.

At this time, the prepreg has an opening 30a to expose the metallic protrusion 11, and the copper foil layer 45 includes the copper foil opening 45a aligned with the opening 30a. The opening 30a and the copper foil opening 45a may be formed through a chemical etching process or a laser etching process, or may be formed through a mechanical process such as punching.

The opening 30a and the copper foil opening 45a have the second width d2 greater than the first width d1 of the metallic protrusion 11, and the distance Δd from the lateral surfaces of the openings 30a and 45a to the metallic protrusion 11 satisfies the following equation.

$$\Delta d = (d2 - d1)/2 \quad \text{Equation}$$

The distance Δd is equal to the thickness of the lateral-surface insulating layer 80 formed by a prepreg that surrounds the lateral surfaces of the metallic protrusion 11 while flowing toward the metallic protrusion 11 due to the thermo-compression of the resin of the prepreg when the stack structure is thermally compressed with respect to the insulating plate 10.

Meanwhile, the second width d2 of the opening 30a may have a size corresponding to at least 80 times greater than the thickness of the prepreg, or may have various sizes according to the temperature and the pressure in the thermo-compression.

Figure 31:
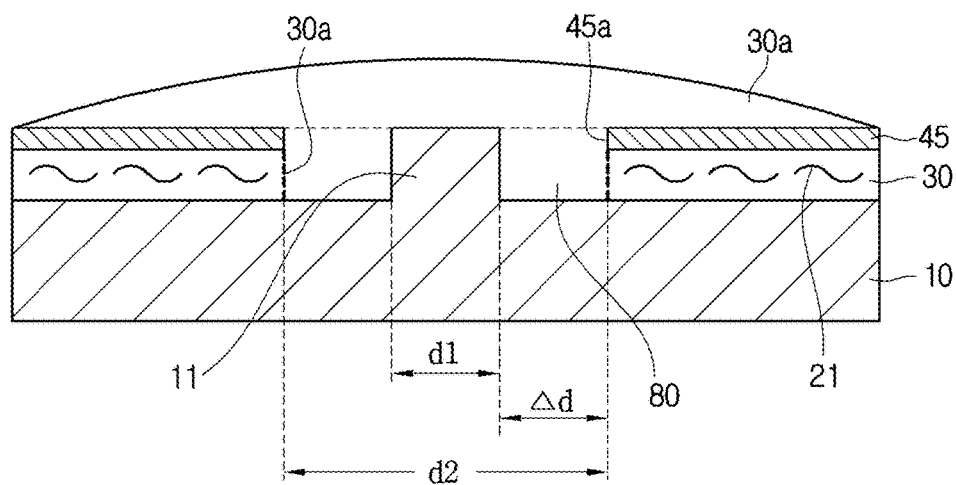

Next, as shown in FIG. 31, the opening 30a of the insulating layer 30 is integrated with the copper foil opening 45a through the thermo-compression in such a manner that the opening 30a is aligned with the copper foil opening 45a while exposing the metallic protrusion 11.

In this case, the prepreg constituting the insulating layer 30 is hardened due to the thermo-compression of the insulating layer 30 and the metallic plate 10, and resin of the prepreg flows to the metallic protrusion 11, so that the resin is filled in the opening 30a of the insulating layer 30 and the copper foil opening 45a.

The resin of the prepreg filled in the opening 30a of the insulating layer 30 is hardened to form the lateral-surface insulating layer 80 surrounding the metallic protrusion 11 while extending from the insulating layer 30, and the insulating layer 30 including the mixture of the resin and the solid component 21 is hardened other than the lateral-surface insulating layer 80.

Figure 32:
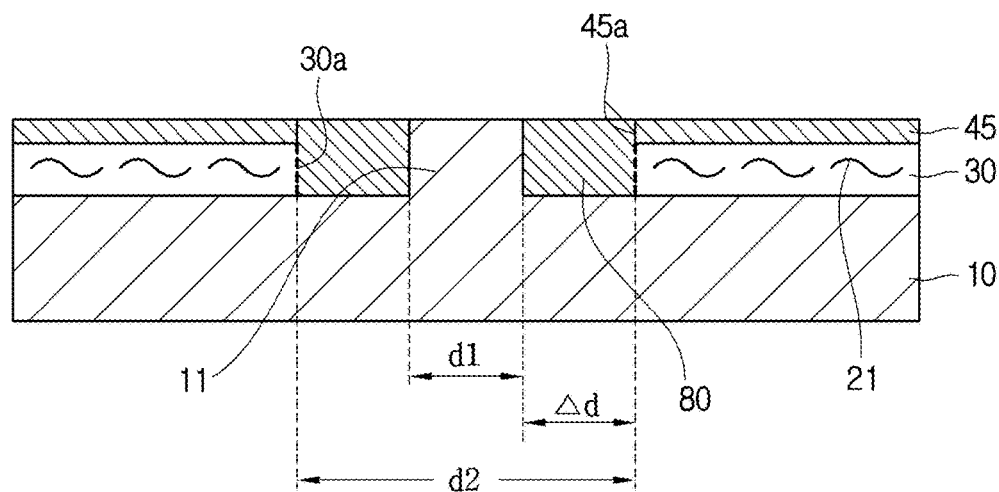

In this case, when the portion 80 of the resin of the lateral-surface insulating layer 80 covers the top surface of the metallic protrusion 11 as shown in FIG. 31, the resin is removed from the top surface of the metallic protrusion 11 to expose the top surface of the metallic protrusion 11 as shown in FIG. 32. Accordingly, the height of the lateral-surface insulating layer 80 is equal to the height of the metallic protrusion 11.

The top surface of the metallic protrusion 11 may be exposed through a de-smear process to remove the smear of the insulating layer 30.

Figure 33:
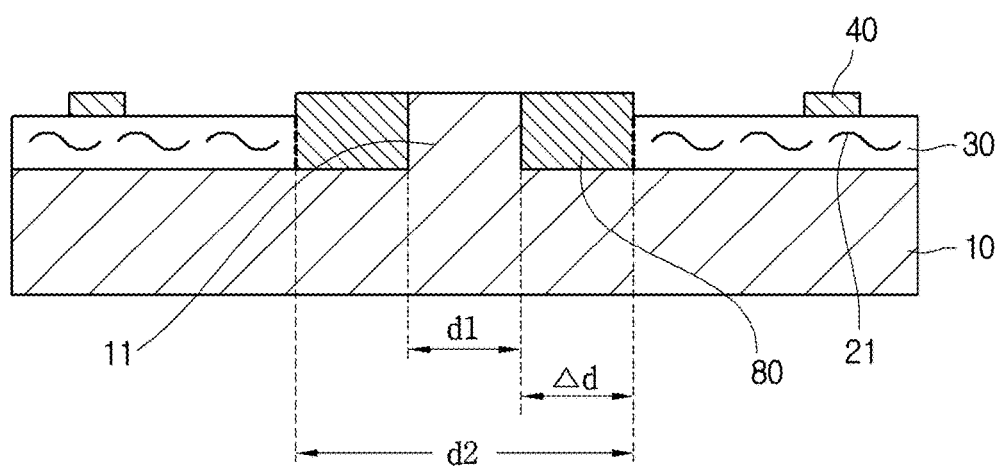
Figure 34:
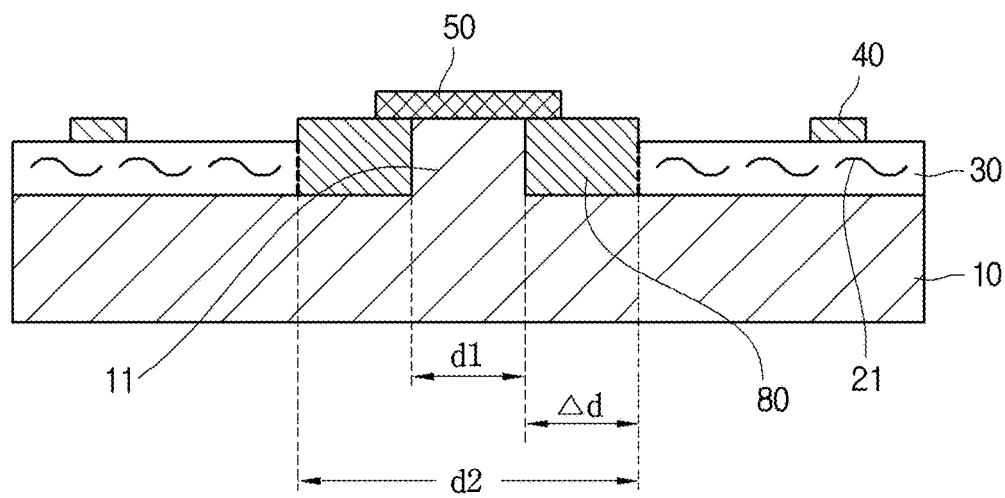

Next, the copper foil layer 45 on the insulating layer 30 is etched with a predetermined pattern as shown in FIG. 33 to form the circuit patterns 40, the cream of the solder 50 is coated on the exposed top surface of the metallic protrusion 11 as shown in FIG. 34, and the heat emitting device 60 is mounted before heat treatment is performed as shown in FIG. 20.

In the radiant heat circuit board 300 shown in FIG. 34, the insulating layer 30 is exposed, and the metallic protrusion 11 directly connected to the metallic plate 10 serves as the mounting pad for the heat emitting device 60, so that heat emitted from the heat emitting device 60 is directly transferred to the metallic plate 10, thereby increasing thermal efficiency.

Hereinafter, a radiant heat circuit board 400 according to a fourth embodiment will be described with reference to FIG. 35.

Figure 35:
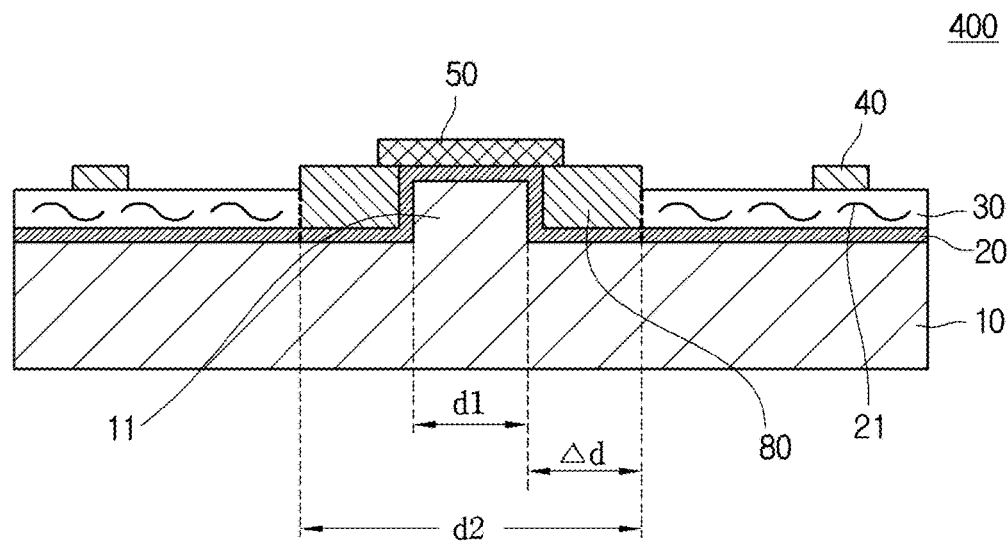
FIG. 35 is a sectional view showing a radiant heat circuit board according to a fourth embodiment.

FIG. 35 is a sectional view showing the radiant circuit board 400 according to the forth embodiment.

Referring to FIG. 35, the radiant heat circuit board 400 according to the fourth embodiment includes the metallic plate 10, the bonding layer 20 formed on the metallic plate 10, and the circuit patterns 40 formed on the insulating layer 30 provided on the bonding layer 20.

In the radiant heat circuit board 400 according to the fourth embodiment, the bonding layer 20 is formed on the metallic plate 10.

The bonding layer 20 increases the adhesive strength between the metallic protrusion 11 protruding from the metallic plate 10 and the solder 50, and may be a layer obtained by coating the metallic plate 10 with an alloy including Cu, which is a material representing a superior adhesive property with respect to the solder 50, preferably, an alloy including Cu or Ni.

The insulating layer 30 and the lateral-surface insulating layer 80 have the same structure as that of FIG. 20.

The bonding layer 20 is formed on the metallic protrusion 11 through a plating process to ensure the adhesive strength with the solder 50.

Naturally, the radiant heat circuit board 400 shown in FIG. 35 can be manufactured through the above methods.

As described above, in the radiant heat circuit board according to the embodiment, the insulating between the metallic protrusion and the circuit patterns adjacent to the metallic protrusion can be ensured by reducing errors that may occur in the manufacturing process.

Hereinafter, the radiant heat circuit board to which the embodiment is applied will be described with reference to FIG. 36.

Figure 36:
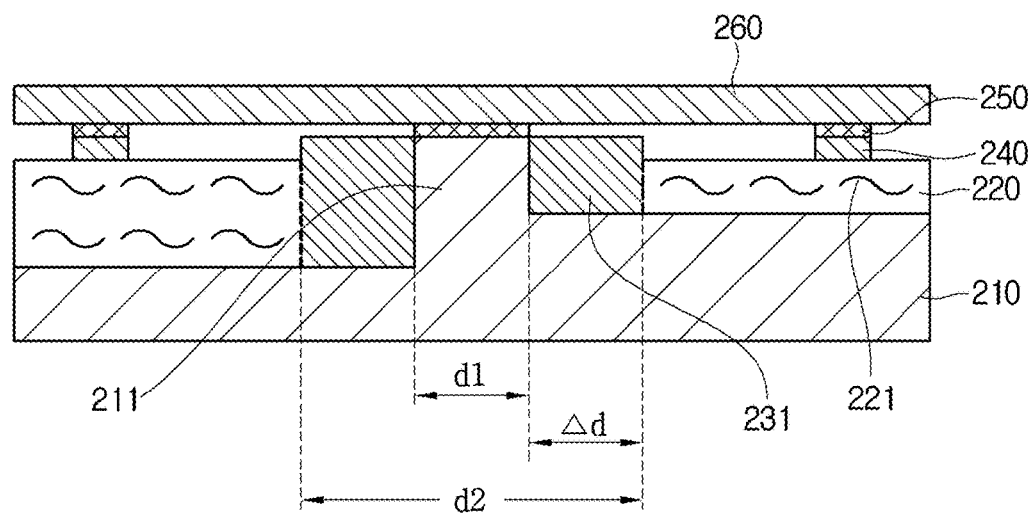
FIG. 36 is a sectional view showing the application of the third embodiment.

FIG. 36 is a sectional view showing the application of the radiant heat circuit board 300 of FIG. 20.

Referring to FIG. 36, the radiant heat circuit board 300 according to the embodiment includes the metallic plate 210 and the circuit patterns 240 formed on the insulating layer 220 provided on the metallic plate 210. The components are the same as those shown in FIG. 2.

The insulating layer 220 may be formed by hardening the prepreg formed by infiltrating the solid component 221 such as tempered glass, glass fiber, or filler into epoxy resin.

A lateral-surface insulating layer 231 including only resin without the solid component 221 is formed closely to the metallic protrusion 211 while extending from the insulating layer 220 to surround the metallic protrusion 211.

The lateral-surface insulating layer 231 may have the height equal to the height of the metallic protrusion 211.

Meanwhile, the metallic protrusion 211 of the metallic plate 210 serves as a mounting pad for a heat emitting device 260. The solder 250 is formed on the metallic protrusion 211 or the circuit pattern 240, and the heat emitting device 260 is formed on the solder 250.

In this case, in the heat emitting circuit board 300 of FIG. 28, when processing the metallic plate 210, the step difference at the left side of the metallic protrusion 211 may differ from the step difference at the right side of the metallic protrusion 211 due to the process deflection.

Hereinafter, the manufacturing process of the radiant heat circuit board of FIG. 36 will be described.

The prepreg of the insulating layer 220 and a copper foil layer used to form the circuit pattern 240 are thermally compressed with the insulating plate 210 as shown in FIGS. 21 to 34, so that the resin of the prepreg is filled in the openings of the insulating layer 220 and the copper foil layer, thereby forming the lateral-surface insulating layer 231.

In this case, if the step differences at both sides are different from each other, thermo-compression is performed to constantly maintain the height of the insulating layer 220, so that the thicknesses of the insulating layer 220 at both sides are different from each other. Next, the resin is removed from the metallic protrusion 211 and the copper foil layer, and the circuit pattern 240 is formed by etching the copper foil layer. In this case, the circuit patterns 240 may have the same height at both sides thereof.

Accordingly, since both circuit patterns 240 have heights different from each other, when the heat emitting device 260 is attached to the solder 250 after the solder 250 has been formed, the heat emitting device 260 can be prevented from being unstably attached to the solder 250 due to asymmetrical force.

In addition, the circuit patterns 240 and the metallic protrusion 211 have the same height although the process errors occur, so that the insulating between the metallic protrusion 211 and the circuit patterns 240 adjacent to the metallic protrusion 211 can be ensured by the lateral-surface insulating layer 231.

Hereinafter, the effects of the radiant heat circuit board according to the embodiment will be described with reference to FIGS. 37A and FIG. 37B.

FIG. 37A is a photograph showing a comparative group according to the embodiment, and FIG. 37B is a photograph showing the top surface of the radiant heat circuit board of FIG. 20.

Differently from the radiant heat circuit board according to the embodiment, FIG. 37A shows a top surface of a radiant heat circuit board in which an insulating prepreg is coated on a metallic plate having a metallic protrusion, an opening to expose the metallic protrusion has a width the same as the width of the metallic protrusion, and a post process is not performed.

As shown in the radiant heat circuit board of FIG. 37A, when a marginal space does not exist between the opening and the metallic protrusion, the resin of the prepreg is moved up along the metallic protrusion in the thermo-compression of the prepreg to reduce the exposed area of the metallic protrusion.

In contrast, similarly to the radiant heat circuit board 300 of FIG. 20 according to the embodiment, when the insulating layer 30 has the opening 30a wider than the width of the metallic protrusion 11, the lateral-surface insulating layer 80 is formed on the lateral surfaces of the metallic protrusion 11 after the thermo-compression of the insulating layer 30, and the top surface of the metallic protrusion 11 is exposed through a post process, thereby ensuring the area of the metallic protrusion 11 as shown in FIG. 37B.

Any reference in this specification to 'one embodiment,' 'an embodiment,' 'example embodiment' etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A radiant heat circuit board used to mount a heat emitting device thereon, the radiant heat circuit board comprising:
   a metallic plate;
   a metallic protrusion protruded from the metallic plate perpendicularly to the metallic plate;
   a first bonding layer on the metallic plate;
   a second bonding layer on the metallic protrusion and surrounding lateral surfaces of the metallic protrusion:
   a first insulating layer on the first bonding layer to expose the second bonding layer and surrounding lateral surfaces of the second bonding layer;
   a second insulating layer on the metallic plate to expose the second bonding layer and surrounding lateral surfaces of the first insulating layer;
   a circuit pattern on the second insulating layer; and
   a solder on the first insulating layer and the second bonding layer,
   wherein the solder has a first bottom surface portion directly contacted with a top surface of the second bonding layer and a second bottom surface portion directly contacted with a top surface of the first insulating layer,
   wherein a top surface of the circuit pattern lies in a same plane as the top surface of the first insulating layer and the top surface of the second bonding layer, and
   wherein bottom surfaces of the first insulating layer and the second insulating layer are directly contacted with a top surface of the first bonding layer.

2. The radiant heat circuit board of claim 1, wherein at least one of the first bonding layer and the second bonding layer is formed by an alloy including copper (Cu) or nickel (Ni) representing a high adhesive property with respect to the solder.

3. The radiant heat circuit board of claim 1, wherein the metallic plate is formed by an alloy including aluminum (Al).

4. The radiant heat circuit board of claim 1, wherein the first and the second insulating layers each includes a plurality of insulating films.

5. The radiant heat circuit board of claim 1, wherein the second insulating layer includes a solid component infiltrated into insulating resin, and
   wherein the first insulating layer includes the insulating resin without the solid component.

6. The radiant heat circuit board of claim 5, wherein the lateral-surface insulating layer extends from the insulating layer while surrounding the metallic protrusion, and includes only the insulating resin.

7. The radiant heat circuit board of claim 5, wherein the solid component includes tempered glass, glass fiber, or filler.

8. The radiant heat circuit board of claim 1, wherein the first insulating layer has a height equal to a height of the metallic protrusion.

9. The radiant heat circuit board of claim 1, wherein the bottom surface of the first insulating layer lies in a same plane as the bottom surface of the second insulating layer.

10. The radiant heat circuit board of claim 1, wherein a thickness of the first insulating layer is different from a thickness of the second insulating layer.

* * * * *